(12) United States Patent
Brooks et al.

(10) Patent No.: US 9,408,298 B2
(45) Date of Patent: Aug. 2, 2016

(54) FLEXIBLE CIRCUIT ROGOWSKI COIL

(71) Applicant: EATON CORPORATION, Cleveland, OH (US)

(72) Inventors: Robert Frederick Brooks, White Oak, PA (US); Theodore J. Miller, Oakdale, PA (US)

(73) Assignee: EATON CORPORATION, Cleveland, OH (US)

( * ) Notice: Subject to any disclaimer, the term of this patent is extended or adjusted under 35 U.S.C. 154(b) by 143 days.

(21) Appl. No.: 14/217,796

(22) Filed: Mar. 18, 2014

(65) Prior Publication Data

US 2015/0271909 A1    Sep. 24, 2015

(51) Int. Cl.
*G01R 15/18*   (2006.01)
*H05K 1/02*    (2006.01)
*G01R 1/02*    (2006.01)

(52) U.S. Cl.
CPC ........ *H05K 1/028* (2013.01); *G01R 1/02* (2013.01); *G01R 15/181* (2013.01)

(58) Field of Classification Search
CPC ..... G01R 19/00; G01R 11/04; H01F 27/2804
USPC ........... 324/127, 76.11, 117 R, 126, 239, 242
See application file for complete search history.

(56) References Cited

U.S. PATENT DOCUMENTS

| | | | | |
|---|---|---|---|---|
| 4,918,418 A | * | 4/1990 | Tsala | G01L 3/102 336/180 |
| 5,389,876 A | * | 2/1995 | Hedengren | G01N 27/904 324/242 |
| 5,414,400 A | | 5/1995 | Gris et al. | |
| 6,380,727 B1 | * | 4/2002 | Jitaru | G01R 15/148 324/117 R |
| 6,593,900 B1 | | 7/2003 | Craven et al. | |
| 6,624,624 B1 | | 9/2003 | Karrer et al. | |
| 7,477,060 B2 | * | 1/2009 | Yu | G01N 17/02 324/693 |
| 7,638,999 B2 | | 12/2009 | Kojovic et al. | |

(Continued)

FOREIGN PATENT DOCUMENTS

EP    2 742 887 A1    6/2014

OTHER PUBLICATIONS

European Patent Office, "International Search Report and Written Opinion", Apr. 30, 2015, 12 pp.

(Continued)

*Primary Examiner* — Huy Q Phan
*Assistant Examiner* — Giovanni Astacio-Oquendo
(74) *Attorney, Agent, or Firm* — Eckert Seamans Cherin & Mellott, LLC; Philip E. Levy; Grant E. Coffield

(57) ABSTRACT

A flexible circuit current measuring apparatus includes a flexible substrate member having a top side and a bottom side, a plurality of first conductive traces disposed on the top side of the flexible substrate member and spaced along a length of the flexible substrate member, and a plurality of second conductive traces disposed on the bottom side of the flexible substrate member and spaced along the length of the flexible substrate member. The first conductive traces and the second conducive traces are electrically connected to one another to form a serpentine pattern having a number of windings about and along the flexible substrate member, and the current measuring apparatus is structured to be wrapped around a conductor for measuring a current carried by the conductor.

6 Claims, 4 Drawing Sheets

(56) References Cited

U.S. PATENT DOCUMENTS

| | | | | |
|---|---|---|---|---|
| 8,436,354 | B2* | 5/2013 | Aoki | H01Q 1/38 257/57 |
| 8,604,669 | B2* | 12/2013 | Hsieh | G01R 15/183 310/328 |
| 2005/0275397 | A1* | 12/2005 | Lightbody | G01R 15/142 324/126 |
| 2006/0109071 | A1* | 5/2006 | Thongsouk | H01F 17/0033 336/200 |
| 2006/0132123 | A1* | 6/2006 | Wang | G01N 27/902 324/239 |
| 2008/0079418 | A1* | 4/2008 | Rea | G01R 15/181 324/117 R |
| 2008/0106253 | A1 | 5/2008 | Kojovic | |
| 2008/0238600 | A1* | 10/2008 | Olson | H01F 17/0006 336/180 |
| 2010/0259247 | A1* | 10/2010 | Ibuki | G01R 15/18 324/127 |
| 2012/0126789 | A1 | 5/2012 | Turpin | |

OTHER PUBLICATIONS

Qing, Chen et al., "Design and Characteristics of Two Rogowski Coils Based on Printed Circuit Board", IEEE Transactions on Instrumentation and Measurement, Jun. 2006, pp. 939-943, vol. 55, No. 3.

Wang, Chengyuan et al., "Design of Printed-Circuit Board Rogowski Coil for Highly Accurate Current Measurement", Proceedings of the 2007 IEEE International Conference on Mechatronics and Automation, Aug. 5-8, 2007, Harbin, China, pp. 3801-3806.

Kojovic, Ljubomir A., "PCB Rogowski Coil Designs and Performances for Novel Protective Relaying", 2003, pp. 609-614.

* cited by examiner

US 9,408,298 B2

FLEXIBLE CIRCUIT ROGOWSKI COIL

BACKGROUND

1. Field

The disclosed concept pertains generally to Rogowski coils and, more particularly, to a Rogowski formed as a flexible circuit.

2. Background Information

A Rogowski coil is a well-known electrical device for measuring alternating current (AC) or high speed current pulses. A typical conventional Rogowski coil consists of a helical coil of wire formed in a toroidal or rectangular shape. The lead from one end of the coil is returned through the center of the coil to the other end to form two terminals that are located at the same end of the coil. In use, the Rogowski as just described is wrapped around a conductor whose current is to be measured. Since the voltage that is induced in the coil is proportional to the rate of change (the derivative) of the current in the conductor, the output of the Rogowski coil is usually connected to an integrator circuit to provide an output signal that is proportional to the current.

There are many applications, however, where use of a traditional Rogowski coil as just described to measure current, while desirable, may not be practical or possible because the toroidal or rectangular shape of the device does not allow it to fit or conform to the application.

SUMMARY

A flexible circuit current measuring apparatus includes a flexible substrate member having a top side and a bottom side, a plurality of first conductive traces disposed on the top side of the flexible substrate member and spaced along a length of the flexible substrate member, and a plurality of second conductive traces disposed on the bottom side of the flexible substrate member and spaced along the length of the flexible substrate member. The first conductive traces and the second conducive traces are electrically connected to one another to form a serpentine pattern having a number of windings about and along the flexible substrate member, and the current measuring apparatus is structured to be wrapped around a conductor for measuring a current carried by the conductor.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
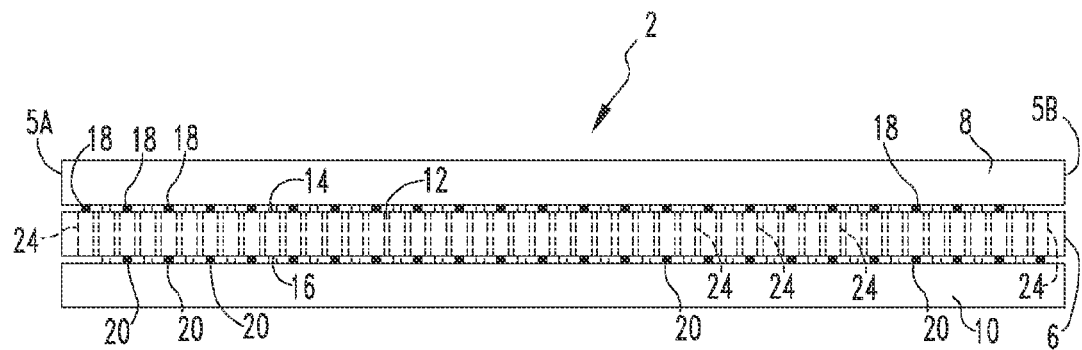
FIG. 1 is side elevational view of a flexible circuit Rogowski coil according to an exemplary embodiment of the disclosed concept in a condition wherein it is lying flat.

Directional phrases used herein, such as, for example, left, right, front, back, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the statement that two or more parts are "coupled" together shall mean that the parts are joined together either directly or joined through one or more intermediate parts.

As employed herein, the term "disposed on" shall mean put or positioned in a particular place directly or indirectly on another object.

Figure 2:
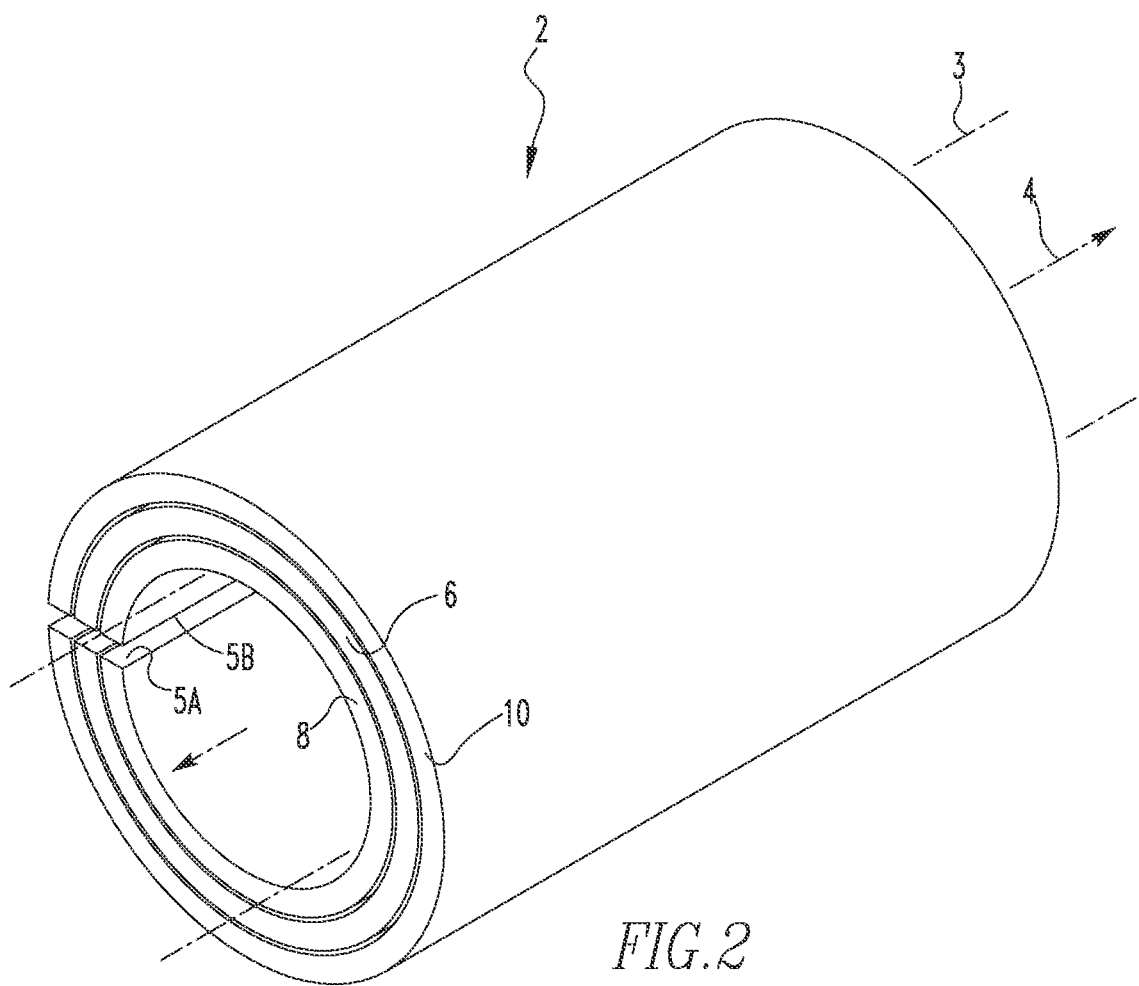
FIG. 2 is an isometric view of the flexible circuit Rogowski coil of FIG. 1 in a condition wherein it has been bent into a cylindrical shape.

FIG. 1 is a side elevational view of a flexible circuit Rogowski coil 2 according to an exemplary embodiment attic disclosed concept in a condition wherein it is lying flat. As described in greater detail herein, Rogowski coil 2 is a multi-layer, flexible circuit device that, as demonstrated in FIG. 2, is structured to be able to be wrapped around a conductor 3 (shown in phantom lines in FIG. 2) whose current is to be measured. When so configured, Rogowski coil 2 will have a generally cylindrical shape having a longitudinal axis 4 shown in FIG. 2. As will be appreciated, in use as just described, the conductor 3 whose current is to be measured will extend along that longitudinal axis 4.

Referring to FIGS. 1 and 2, in the exemplary embodiment, Rogowski coil 2 has three layers, namely a central circuit layer 6, top protective layer 8, and a bottom protective layer 10. Both top protective layer 8 and bottom protective layer 10 are flexible substrate members, made of, for example and without limitation, a polyimide (PI) such as Kapton®, polyester (PET), polyethylene napthalate (PEN), Polyetherimide (PEI), various fluropolymers (FEP), or another suitable polymer material.

Figure 3:
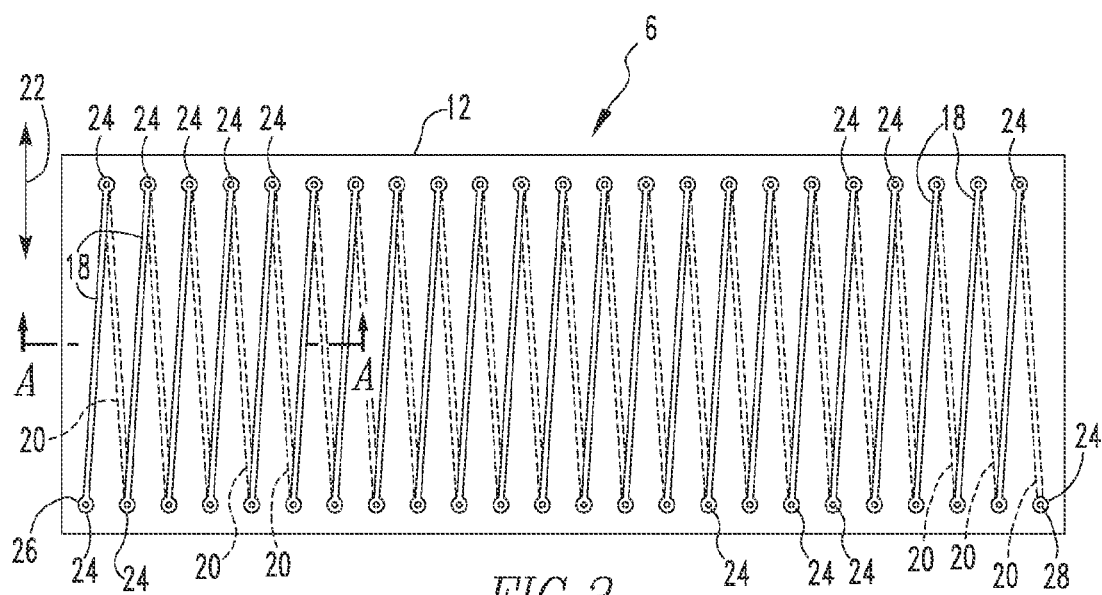
FIG. 3 is a top plan view of a circuit layer forming a part of the flexible circuit Rogowski coil of FIGS. 1 and 2 according to the exemplary embodiment.
Figure 4:
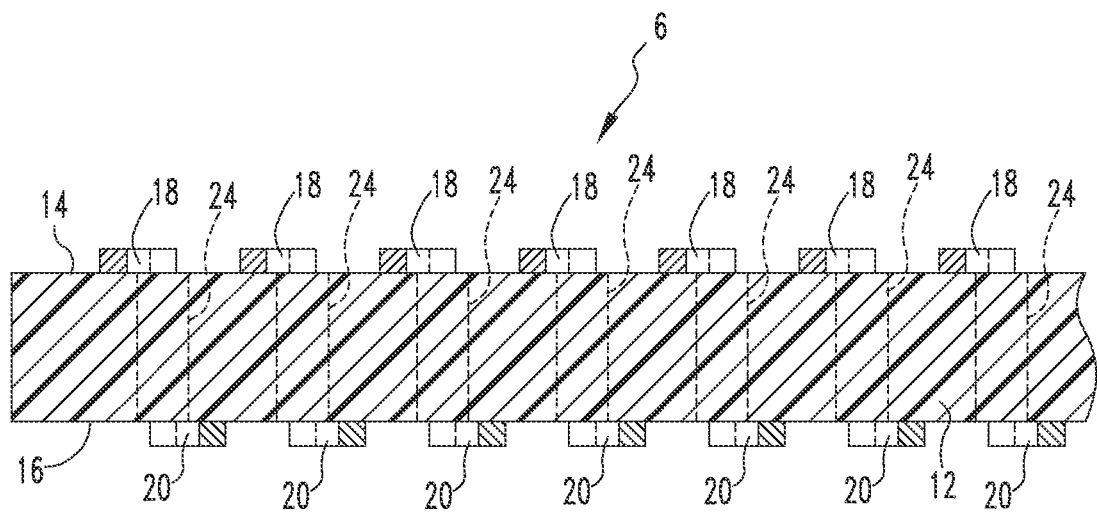
FIG. 4 is a partial cross-sectional view of the circuit layer taken along lines A-A of FIG. 3.

Circuit layer 6 is positioned in between top protective layer 8 and bottom protective layer 10. FIG. 3 is a top plan view of circuit layer 6 according to the exemplary embodiment, and FIG. 4 is a partial cross-sectional view of circuit layer 6 taken along lines A-A of FIG. 3. Circuit layer 6 includes a central flexible substrate member 12 having a top surface 14 and a bottom surface 16. In the exemplary embodiment, flexible substrate member 12 is made of, for example and without limitation, a polyimide such as Kapton®, polyester (PET), polyethylene napthalate (PEN), Polyetherimide (PEI), various fluropolymers (FEP), or another suitable polymer material.

Top surface 14 of flexible substrate member 12 includes a number of separate top conductive traces 18 that are spaced along the length of top surface 14. Each of the top conductive traces 18 extends laterally across the width of top surface 14 and is oriented at an angle (non-zero angle) with respect to a direction, indicated by the arrow 22 in FIG. 3, that is perpendicular to the longitudinal axis of flexible substrate member 12. Each top conductive trace 18 is made of a conductive material, such as, without limitation, copper or another metal, that may be printed onto top surface 14.

Similarly, bottom surface 16 of flexible substrate member 12 includes a number of separate bottom conductive traces 20 that are spaced along the length of bottom surface 16. Bottom conductive traces 20 are shown in phantom lines in FIG. 3.

Each of the bottom conductive traces 20 extends laterally across the width of bottom surface 16 and is oriented at angle (non-zero angle) with respect to the direction indicated by the arrow 22 in FIG. 3. Each bottom conductive trace 20 is made of a conductive material, such as, without limitation, copper or another metal, that may be printed onto bottom surface 16.

As seen in FIG. 3, immediately adjacent top conductive traces 18 and bottom conducive traces 20 are electrically connected to one another through conductive vias 24 provided in through flexible substrate member 12 (at positions that are spaced from the lateral edges of flexible substrate member 12) such that the top conductive traces 18 and bottom conducive traces 20 form a serpentine pattern having a number of windings about and along flexible substrate member 12. As used herein, the term "serpentine" shall mean a line, course, or progression characterized by turns (which may be sharp) first to one side and then to the other, such as a zigzagging or snaking pattern. In addition, the end of the first top conductive trace 18 forms a first terminal 26, and the end of the last bottom conductive trace 20 forms a second terminal 28.

In operation, Rogowski coil 2 is wrapped around a conductor whose current is to be measured, such as conductor 3 in FIG. 2, in a manner wherein the first and second terminal ends 5A and 5B of Rogowski coil 2 are brought into close proximity with one another. This is made possible by the flexible nature of the various layers of Rogowski coil 2 as described herein. In one exemplary embodiment, the first and second terminal ends 5A and 5B of Rogowski coil 2 are brought together as closely as possible to minimize or avoid any gaps. As a result, a voltage will be induced in the conductive serpentine formed by conductive traces 18 and 20 that is proportional to the rate of change (derivative) of the current in the conductor. Thus, terminals 26 and 28 of Rogowski coil 2 may be connected to an integrator circuit to provide an output signal that is proportional to the current in the conductor.

Figure 5:
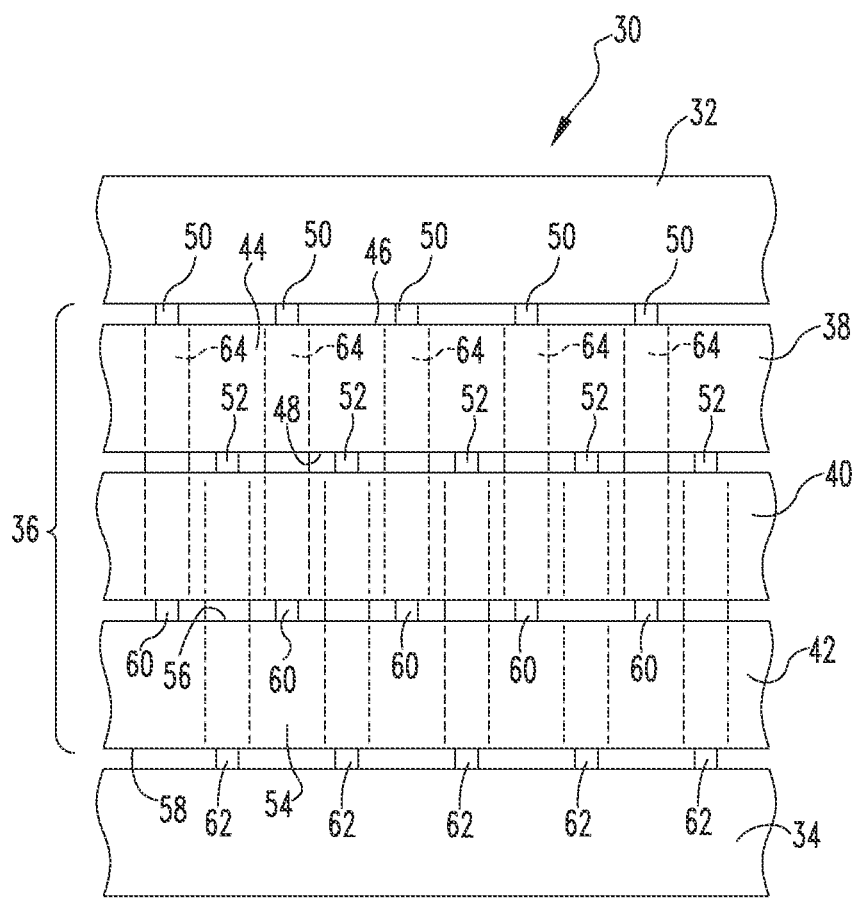
FIG. 5 is a side elevational view of a flexible circuit Rogowski coil according to an alternative exemplary embodiment of the disclosed concept in a condition wherein it is lying flat.

FIG. 5 is a side elevational view of a flexible circuit Rogowski coil 30 according to an alternative exemplary embodiment of the disclosed concept in a condition wherein it is lying flat. Like Rogowski coil 2, Rogowski coil 30 is a multi-layer, flexible circuit device that is structured to be able to be wrapped around a conductor whose current is to be measured. When so configured, Rogowski coil 30 will have a generally cylindrical shape similar to that shown in FIG. 2.

While Rogowski coil 2 is a three layer device, Rogowski coil 30 employs additional layers (five in the illustrated embodiment described below) in order to increase the number of windings of Rogowski coil 30 as described herein. Increasing the number of windings in turn increases or enhances the level of the output signal produced by Rogowski coil 30.

Referring to FIG. 5, in the exemplary embodiment, Rogowski coil 30 has five layers, namely a top protective layer 32, a bottom protective layer 34, and a three-layer layer circuit section 36 provided in between top protective layer 32 and bottom protective layer 34 that includes atop circuit layer 38, a middle circuit layer 40 and a bottom circuit layer 42. Both top protective layer 8 and bottom protective layer 10 are flexible substrate members made of, for example and without limitation, a polyimide such as Kapton® or another polymer as described herein. In addition, middle circuit layer 40 is also a flexible substrate member made of, for example and without limitation, a polyimide such as Kapton® or another polymer as described herein, that is provided with conductive vias as described herein. Top circuit layer 38 and bottom circuit layer 42 are described in detail below.

Figure 6:
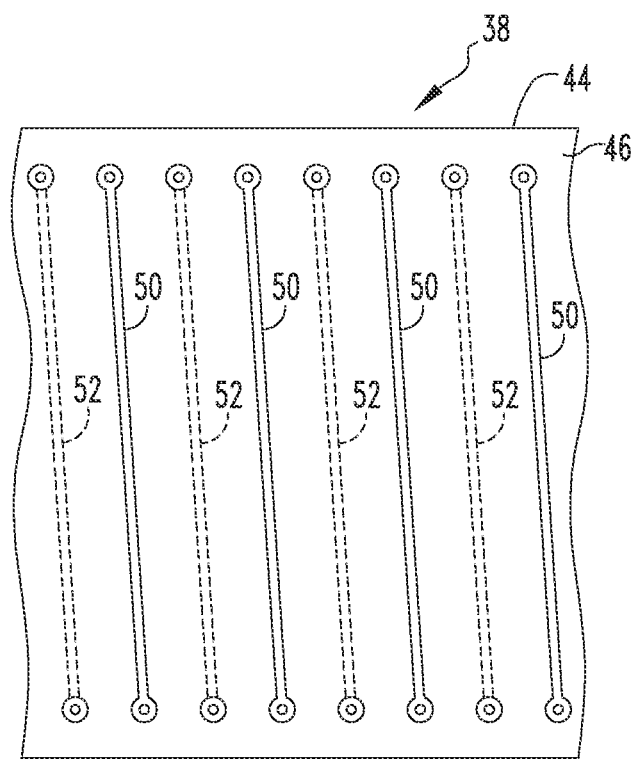
FIGS. 6 and 7 are top plan views of circuit layers forming a part of the flexible circuit Rogowski coil of FIG. 5 according to the exemplary embodiment.

FIG. 6 is a top plan view of top circuit layer 38 according to the exemplary embodiment. Top circuit layer 38 includes a central flexible substrate member 44 having atop surface 46 and a bottom surface 48. In the exemplary embodiment, flexible substrate member 44 is made of, for example and without limitation, a polyimide such as Kapton® or another polymer as described herein. Top surface 46 of flexible substrate member 44 includes a number of separate top conductive traces 50 that are spaced along the length of top surface 46. Each of the top conductive traces 50 extends laterally across the width of top surface 46 and is oriented at angle (non-zero angle) with respect to a direction that is perpendicular to the longitudinal axis of flexible substrate member 44. Similarly, bottom surface 48 of flexible substrate member 44 includes a number of separate bottom conductive traces 52 that are spaced along the length of bottom surface 48. Bottom conductive traces 52 are shown in phantom lines in FIG. 6. Each of the bottom conductive traces 52 extends laterally across the width of bottom surface 48 and is oriented at angle (non-zero angle) with respect to the direction that is perpendicular to the longitudinal axis of flexible substrate member 44. Each top conductive trace 50 and each bottom conductive trace 52 is made of a conductive material, such as, without limitation, copper or another metal foil material, that may be printed onto the respective surface.

Figure 7:
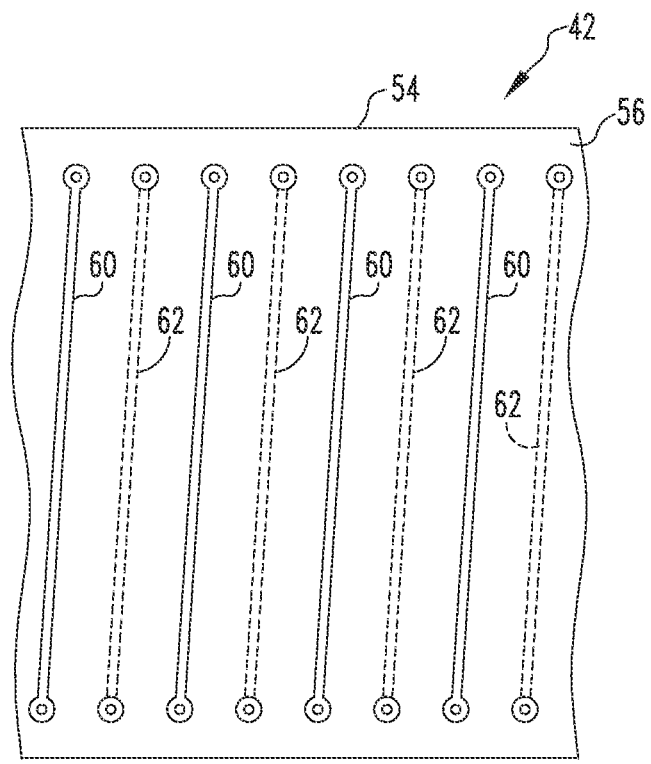

FIG. 7 is a top plan view of bottom circuit layer 42 according to the exemplary embodiment. Bottom circuit layer 40 includes a central flexible substrate member 54 having a top surface 56 and a bottom surface 58. In the exemplary embodiment, flexible substrate member 54 is made of, for example and without limitation, a polyimide (PI) such as Kapton®, polyester (PET), polyethylene napthalate (PEN), Polyetherimide (PEI), various fluropolymers (FEP), or another suitable polymer material. Top surface 56 of flexible substrate member 54 includes a number of separate top conductive traces 60 that are spaced along the length of top surface 56. Each of the top conductive traces 60 extends laterally across the width of top surface 56 and is oriented at angle (non-zero angle) with respect to a direction that is perpendicular to the longitudinal axis of flexible substrate member 54. Similarly, bottom surface 58 of flexible substrate member 54 includes a number of separate bottom conductive traces 62 that are spaced along the length of bottom surface 58. Bottom conductive traces 62 are shown in phantom lines in FIG. 7. Each of the bottom conductive traces 62 extends laterally across the width of bottom surface 58 and is oriented at angle (non-zero angle) with respect to the direction that is perpendicular to the longitudinal axis of flexible substrate member 54. Each top conductive trace 60 and each bottom conductive trace 62 is made of a conducive material, such as, without limitation, copper or another metal foil, that may be printed onto the respective surface.

When circuit section 36 is assembled, middle circuit layer 40 is positioned between top circuit layer 38 and bottom circuit layer 42. In addition, immediately adjacent top conductive traces 50 and top conducive traces 60 are electrically connected to one other through conductive vias 64 shown in FIG. 5 such that the top conductive traces 50 and top conducive traces 60 form a first serpentine pattern having a number of windings about flexible substrate members 44 and 40. Similarly, immediately adjacent bottom conductive traces 52 and bottom conducive traces 62 are electrically connected to one another through conductive vias 66 shown in FIG. 5 such that the bottom conductive traces 52 and bottom conducive traces 62 form a second serpentine pattern having a number of windings about flexible substrate members 40 and 54. Also, the last top conductive trace 60 of bottom circuit layer 42 is electrically connected to the last bottom conductive trace 52 of top circuit layer 38 such that the first and second serpentines are electrically connected to one another to form a single combined serpentine structure. In such a configuration, the ends of the first top conductive trace 50 and the first bottom conductive trace 62 form the first and last ends of the combined serpentine structure and act as first and second terminals for Rogowski coil 30.

In operation, Rogowski coil 30 is wrapped around a conductor whose current is to be measured in a manner similar to that shown in FIG. 2. This is made possible by the flexible nature of the various layers of Rogowski coil 30 as described herein. As a result, a voltage will be induced in the combined serpentine structure that is proportional to the rate of change (derivative) of the current in the conductor. Thus, the terminals of Rogowski coil 30 may be connected to an integrator circuit to provide an output signal that is proportional to the current in the conductor.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A flexible circuit current measuring apparatus, comprising:
   a first flexible substrate member having a top side and a bottom side;
   a second flexible substrate member disposed on the top side of the first flexible substrate member;
   a third flexible substrate member disposed on the bottom side of the first flexible substrate member;
   a plurality of first conductive traces disposed directly on the second flexible substrate member and spaced along a length of the second flexible substrate member;
   a plurality of second conductive traces disposed between the first flexible substrate member and the third flexible substrate member and spaced along the length of the first flexible substrate member, wherein the first conductive traces and the second conducive traces are electrically connected to one another to form a serpentine pattern having a number of windings about and along the first and second flexible substrate members; and
   a plurality of third conductive traces and a plurality of fourth conductive traces, wherein the fourth conductive traces are disposed directly on the third flexible substrate member and the third conductive traces are disposed between the first flexible substrate member and the second flexible substrate member, wherein the third conductive traces and the fourth conducive traces are electrically connected to one another to form a second serpentine pattern having a number of windings about and along the first and third flexible substrate members, and wherein the current measuring apparatus is structured to be wrapped around a conductor for measuring a current carried by the conductor.

2. The current measuring apparatus according to claim 1, wherein the serpentine pattern and the second serpentine pattern are electrically connected to one another.

3. The current measuring apparatus according to claim 2, further comprising a first protective flexible substrate member disposed directly on the first conductive traces opposite the first flexible substrate member and a second protective flexible substrate member disposed directly on the fourth conductive traces opposite the first flexible substrate member.

4. The current measuring apparatus according to claim 1, wherein adjacent ones of the first conductive traces and the second conducive traces are electrically connected to one another through conductive vias provided through the first flexible substrate member and the second flexible substrate member and wherein adjacent ones of the third conductive traces and the fourth conducive traces are electrically connected to one another through conductive vias provided through the first flexible substrate member and the third flexible substrate member.

5. The current measuring apparatus according to claim 1, wherein each of the third conductive traces extends laterally across a width of the first flexible substrate member and each of the fourth conductive traces extends laterally across the width of the first flexible substrate member.

6. The current measuring apparatus according to claim 5, wherein each of the third conductive traces is oriented at a non-zero angle with respect to a direction that is perpendicular to a longitudinal axis of the first flexible substrate member and each of the fourth conductive traces is oriented at a non-zero angle with respect to the direction that is perpendicular to the longitudinal axis of the first flexible substrate member.

\* \* \* \* \*